United States Patent [19]
Faue et al.

[11] Patent Number: 6,128,236
[45] Date of Patent: Oct. 3, 2000

[54] CURRENT SENSING DIFFERENTIAL AMPLIFIER WITH HIGH REJECTION OF POWER SUPPLY VARIATIONS AND METHOD FOR AN INTEGRATED CIRCUIT MEMORY DEVICE

[75] Inventors: Jon Allan Faue; Harold Brett Meadows, both of Colorado Springs, Colo.

[73] Assignees: Nippon Steel Semiconductor Corp., Chiba, Japan; United Memories, Inc., Colorado Springs, Colo.

[21] Appl. No.: 09/213,761

[22] Filed: Dec. 17, 1998

[51] Int. Cl.$^7$ ........................................... G11C 7/02
[52] U.S. Cl. ........................ 365/207; 365/205; 365/208
[58] Field of Search .................................... 365/207, 205, 365/208

[56] References Cited

U.S. PATENT DOCUMENTS

| | | | |
|---|---|---|---|
| 5,525,919 | 6/1996 | Phelan | 327/52 |
| 5,577,000 | 11/1996 | Asami | 365/205 |
| 5,663,915 | 9/1997 | Mobley | 365/208 |
| 5,886,546 | 3/1999 | Hwang | 327/103 |
| 5,949,729 | 9/1999 | Suyama et al. | 365/207 |

Primary Examiner—David Nelms
Assistant Examiner—Hien Nguyen
Attorney, Agent, or Firm—William J. Kubida; Hogan & Hartson LLP

[57] ABSTRACT

A current sensing differential amplifier with high rejection of power supply variations and method for an integrated circuit memory device which allows the amplifier's differential voltage level and speed to track that of the sense amplifier supplying the information, thereby achieving the needed margin for critical synchronous timing. The reliability of the differential amplifier is also increased due to the provision of a larger differential signal and higher supply voltage levels. In a preferred embodiment, an n-channel transistor serves as a regulator with its drain terminal coupled to an unregulated supply voltage source ("$V_{cc}$"). The gate of the transistor is then coupled to a regulated supply voltage ("$V_{ccp}$") which is a function of the voltage supply for the sense amplifier. The source of the transistor is connected to the sources of the p-channel transistors in the main amplifier which provide feedback to the main amplifier. Consequently, the source side of the feedback transistors cannot go to a voltage higher than $V_{ccp}-V_{tn}$ (the threshold voltage of the n-channel transistor), even for wide variations in voltage on the $V_{cc}$ voltage source.

15 Claims, 6 Drawing Sheets

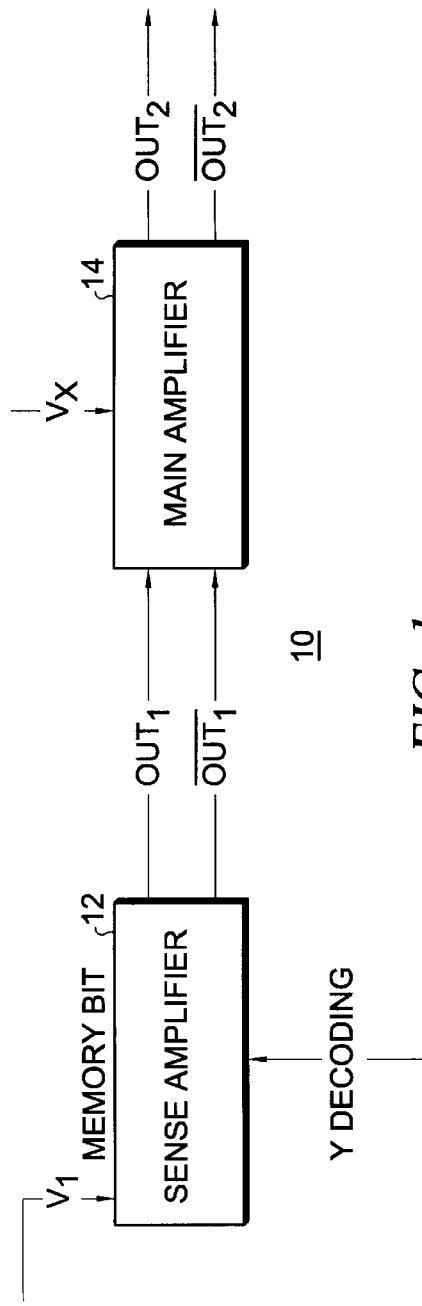
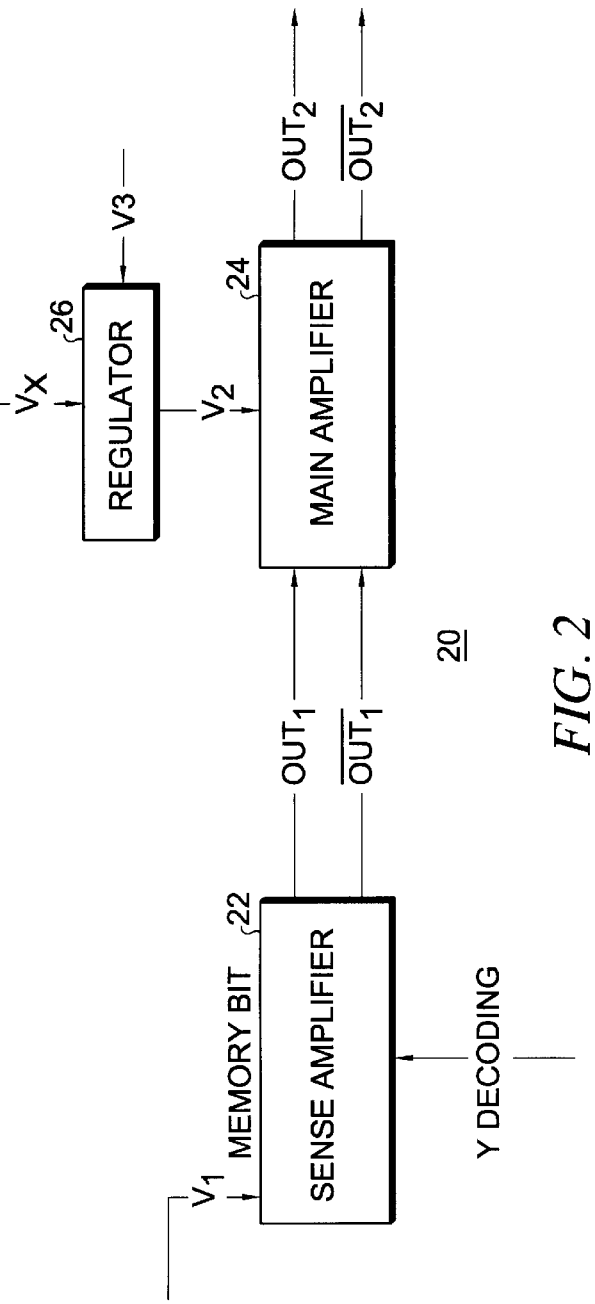
FIG. 1
PRIOR ART
FIG. 2

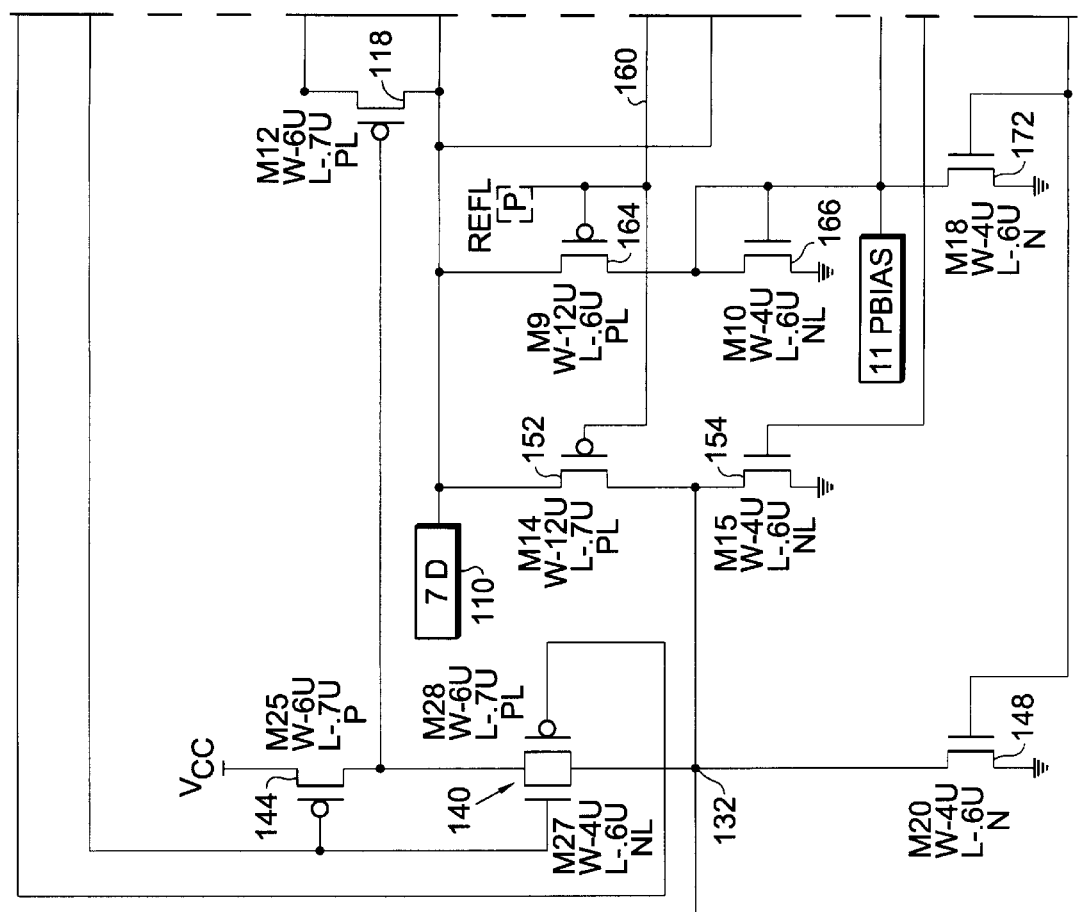

CURRENT SENSING DIFFERENTIAL AMPLIFIER WITH HIGH REJECTION OF POWER SUPPLY VARIATIONS AND METHOD FOR AN INTEGRATED CIRCUIT MEMORY DEVICE

CROSS REFERENCE TO RELATED PATENTS

The present invention is related to the subject matter disclosed in U.S. Pat. No. 5,663,915 assigned to United Memories, Inc., Colorado Springs, Colo. and Nippon Steel Semiconductor Corporation, Tateyama, Japan, assignees of the present invention, the disclosure of which is herein specifically incorporated by this reference.

BACKGROUND OF THE INVENTION

The present invention relates, in general, to the field of integrated circuit ("IC") devices. More particularly, the present invention relates to a current sensing differential amplifier with high rejection of power supply variations of particular utility with respect to differential main amplifiers utilizing multiple power supplies such as those used in certain integrated circuit memory devices, including synchronous dynamic random access memories ("SDRAMs").

In certain differential main amplifier designs, the input signal differential voltage is based on a regulated voltage supply while the feedback and switching speed is based on that of an unregulated supply voltage source such as $V_{cc}$. This renders acceptable function in a synchronous system problematic in light of potential variations in the unregulated supply voltage source. For example, at increased levels of $V_{cc}$, too much feedback may be induced in the amplifier compressing the differential from the sense amplifier input signal and causing the amplifier to be excessively fast when reading data. This can result in an erroneous latching of data in a synchronous DRAM device. Moreover, the compression of the differential signal also introduces the possibility of noise coupling on the signals thus allowing for the potential amplification of the wrong data.

SUMMARY OF THE INVENTION

The differential amplifier of the present invention allows the amplifier's differential voltage level and speed to track that of the sense amplifier supplying the information. In this manner, the needed margin for critical synchronous timing is achieved. Further, the reliability of the differential amplifier is increased due to the provision of a larger differential signal and higher supply voltage levels.

In a preferred embodiment disclosed herein, the differential amplifier of the present invention utilizes an n-channel transistor serving as a regulator with its drain terminal coupled to a supply voltage source ("$V_{cc}$"). The gate of the transistor is then coupled to a supply voltage ("$V_{ccp}$") which is a function of the voltage supply for the sense amplifier that provides input into the main amplifier. The source of the transistor is connected to the sources of the p-channel transistors in the main amplifier which provide feedback to the main amplifier. Consequently, the source side of the feedback transistors cannot go to a voltage higher than $V_{ccp} - V_{tn}$ (the threshold voltage of the n-channel transistor), even for wide variations in voltage on the $V_{cc}$ voltage source. Because the full, unregulated external power supply voltage $V_{cc}$ may still used to power certain other portions of an integrated circuit device incorporating the differential amplifier of the present invention, overall power savings may be realized in addition to the provision of a higher operational speed margin.

Particularly disclosed herein is an integrated circuit memory device comprising a sense amplifier and an associated differential amplifier. The sense amplifier is coupled to a first regulated voltage source and the differential amplifier has an unregulated voltage source associated with it. The differential amplifier comprises a regulator coupled to the unregulated voltage source and a second regulated voltage source which is a function of the first regulated voltage source, the regulator furnishing a regulated voltage output to the differential amplifier which is a function of the first and second regulated voltage sources.

Still further disclosed herein is a method for furnishing a regulated voltage to a differential amplifier associated with an unregulated voltage source in an integrated circuit memory device including a sense amplifier coupled to a regulated voltage source. The method comprises the steps of: coupling the unregulated voltage source to a first input of a voltage regulator associated the said differential amplifier; supplying a second regulated voltage to a second input of the voltage regulator, the second regulated voltage being a function of a voltage output of the regulated voltage source; and providing the regulated voltage to the differential amplifier, the regulated voltage being a function of said second regulated voltage.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1 is a simplified logic block diagram of a portion of a prior art integrated circuit memory device, for example a synchronous DRAM, illustrating the input of a regulated voltage ("$V_1$") to the sense amplifier and the corresponding input of an unregulated voltage ("$V_x$") to the device main amplifier;

FIG. 2 is a corresponding simplified logic block diagram of an integrated circuit memory device incorporating a current sensing differential amplifier in accordance with the present invention effectuated by applying the unregulated voltage $V_x$ to a regulator which has as input a voltage ("$V_3$") which is a function of voltage $V_1$ to supply a voltage ("$V_2$") no greater than $V_3$ minus a threshold voltage to the main amplifier, which voltage $V_2$ is also a function of $V_1$;

DESCRIPTION OF A PREFERRED EMBODIMENT

Figure 3B:
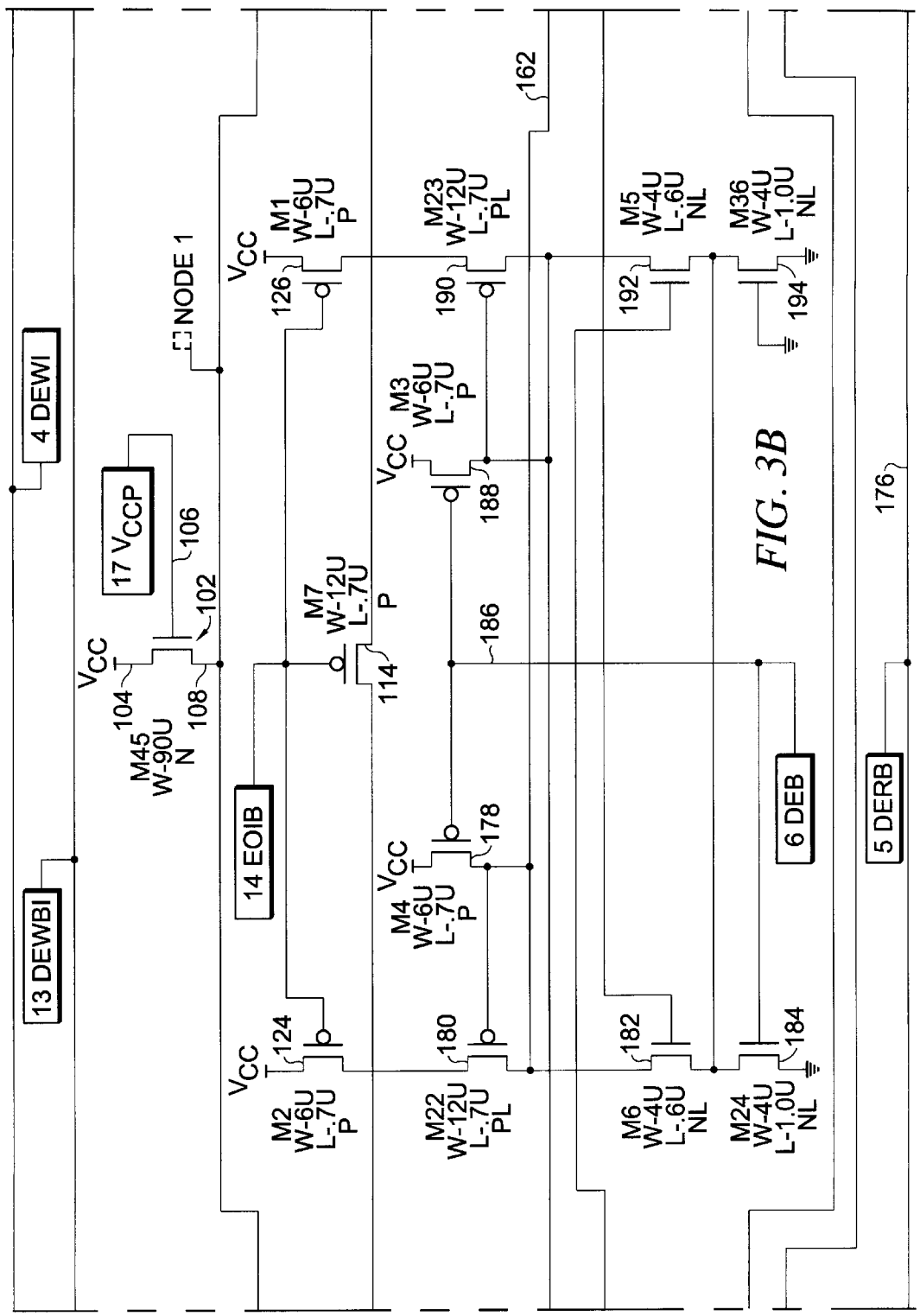
FIG. 3 is a detailed, gate level schematic diagram of the first stage of an output data amplifier corresponding to the regulator and main amplifier of FIG. 2 showing an n-channel transistor serving the regulator function with its gate terminal coupled to a voltage $V_{ccp}$.

With reference now to FIG. 1, a conventional portion of an integrated circuit memory device 10 is shown. The memory device 10 comprises among other circuit elements and subsystems, a sense amplifier 12 which receives a regulated power supply voltage ("$V_1$"). The sense amplifier 12 produces in response to Y decoding an $OUT_1$ signal and its complement having a relatively small voltage differential for input to a main (or differential) amplifier 14 which amplifies the same signals to produce an $OUT_2$ and its complement signals having a relatively larger voltage differential. The main amplifier is powered by an unregulated main supply voltage ("$V_x$") which may be, for example, $V_{cc}$ and the like.

With reference additionally now to FIG. 2, a portion of a memory device 20 incorporating a differential (or main) amplifier in accordance with the present invention is shown. As in the conventional design of FIG. 1, a sense amplifier 22 receives a regulated voltage $V_1$, and in response to Y decoding produces complementary signals $OUT_1$ and $\overline{OUT}_1$ for input to a main amplifier 24 where a larger differential voltage signals $OUT_2$ and $\overline{OUT}_2$ are provided.

In this instance, however, the unregulated voltage $V_x$ is first applied to a regulator 26 which receives as input a voltage $V_3$ which is a function of the regulated voltage $V_1$ (i.e. $V_3=f(V_1)$). The output of the regulator 26 is a voltage $V_2$ which is a function of voltage $V_3$ (i.e. $V_2=f(V_3)$). Consequently, the voltage $V_2$ is then a function of the regulated voltage $V_1$, or $V_2=f(V_1)$. This regulated voltage $V_2$ is then supplied to the main amplifier 24.

Figure 3C:
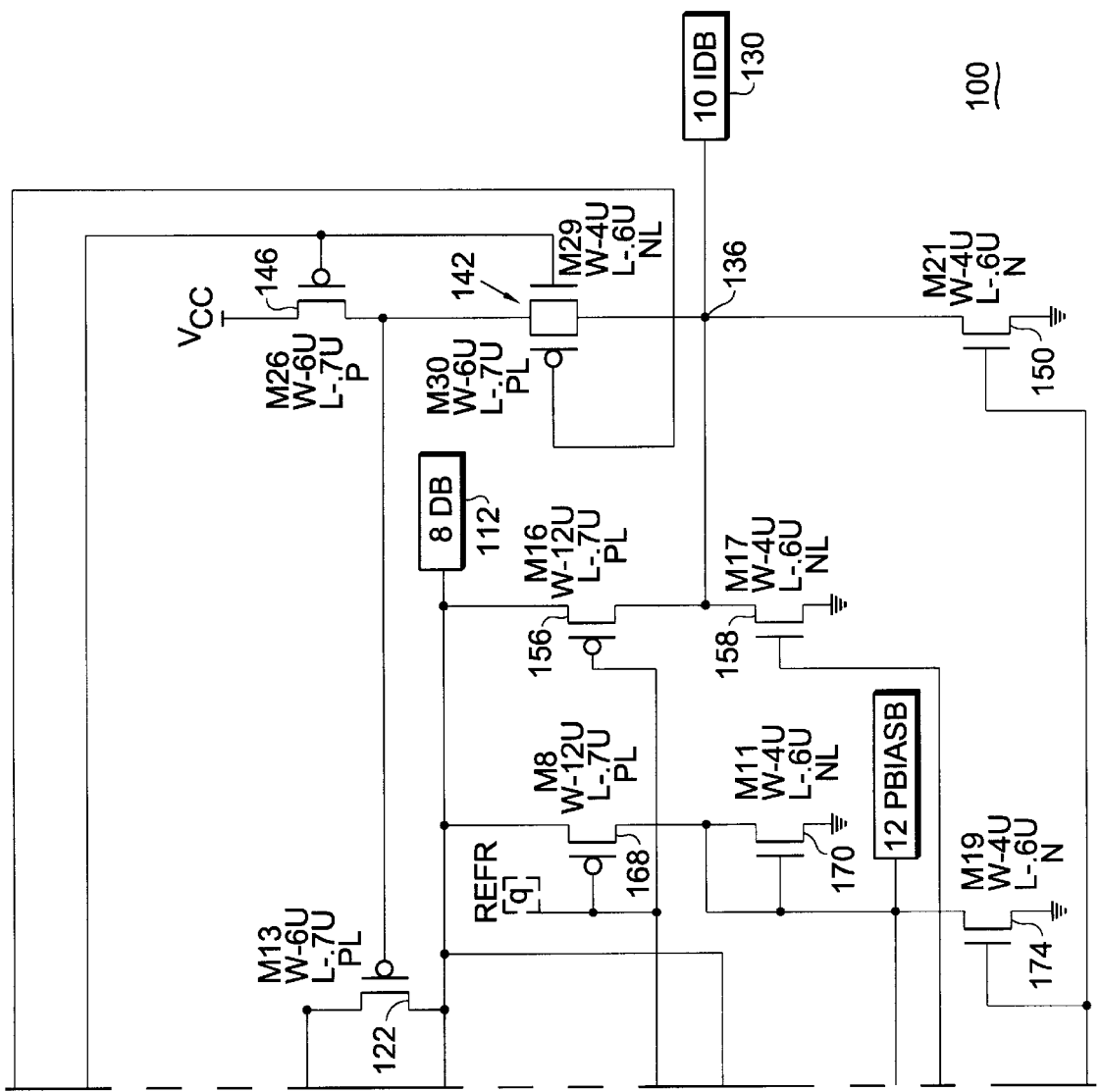

With reference additionally now to FIG. 3, a first stage of a differential amplifier 100 comprising the main amplifier 24 and regulator 26 of FIG. 2 is shown. The amplifier 100 illustrates one possible embodiment of the regulator 26 (FIG. 2) in the form of an n-channel MOS transistor 102. The transistor 102 has its source terminal 104 coupled to a supply voltage $V_{cc}$, its gate terminal 106 coupled to another supply voltage $V_{ccp}$ and its drain terminal 108 coupled to a circuit node ("NODE 1"). In the exemplary implementation shown, the voltage source $V_{cc}$ is an unregulated external supply voltage (i.e. "$V_x$") while the voltage source $V_{ccp}$ is a function of the voltage source $V_1$ (FIG. 2), or "$V_3$". This then places the NODE 1 voltage at the drain 108 of transistor 104 at $V_{ccp}-V_{tn}$ (or $V_2=V_3-V_{tn}$) which is then an effectively regulated input voltage to the amplifier 100.

The amplifier 100 includes differential inputs 110 ("D") and 112 ("DB") which are driven by the sense amplifier 22 as $OUT_1$ and $\overline{OUT}_1$ (FIG. 2). The amplifier 100 then provides amplified differential output signals $OUT_2$ and $\overline{OUT}_2$ on outputs 128 ("ID") and 130 ("IDB") respectively as will be more fully described hereinafter. Input 110 is tied to the drain terminal of p-channel transistor 118 which has its source terminal coupled to node 108 and its gate terminal connected to the drain terminal of transistor 144. In like manner, input 112 is tied to the drain terminal of p-channel transistor 122 which also has its source terminal coupled to node 108 and its gate terminal coupled to the drain terminal of transistor 146. Inputs 110 and 112 are respectively coupled to the drain terminals of p-channel transistors 124 and 126 as well as to opposing terminals of p-channel transistor 114. The source terminals of transistors 124 and 126 are coupled to $V_{cc}$ while the gate terminals of transistors 114, 124 and 126 are common connected to the input EOIB as shown.

Outputs 128 and 130 are respectively applied to nodes 132 and 136. Node 132 is coupled to the drain terminal of n-channel transistor 148 which has its source terminal coupled to circuit ground. Node 132 is further coupled through a parallel coupled p-channel and n-channel transistor pair 140 to the drain terminal of p-channel transistor 144 which has its source terminal coupled to $V_{cc}$. Similarly, Node 136 is coupled to the drain terminal of n-channel transistor 150 which has its source terminal coupled to circuit ground. Node 136 is further coupled through a parallel coupled p-channel and n-channel transistor pair 142 to the drain terminal of p-channel transistor 146 which has its source terminal coupled to $V_{cc}$. The gate terminals of transistors 148 and 150 are connected together at node 176 ("DERB") while the gate terminals of the n-channel transistors of the transistor pairs 140 and 142 are coupled together with the gate terminal of transistors 144, 146 ("DEWBI") and the gate terminals of the p-channel transistors of the transistor pairs 140, 142 are coupled to each other. ("DEWI").

Node 132 is coupled to the drain terminal of p-channel transistor 152 which has its source terminal connected to input 110 and is coupled to circuit ground through series connected n-channel transistor 154. Correspondingly, node 136 is coupled to the drain terminal of p-channel transistor 156 which has its source terminal connected to input 112 and is coupled to circuit ground through series connected n-channel transistor 158. The gate terminal of transistor 152 defines a node 160 which is coupled, inter alia, to the gate terminal of a p-channel transistor 164. The p-channel transistor 164 is connected in series with diode coupled n-channel transistor 166 between input 110 and circuit ground. As is also shown, the gate terminal of transistor 156 defines a node 162 which is coupled, inter alia, to the gate terminal of a p-channel transistor 168. The p-channel transistor 168 is connected in series with diode coupled n-channel transistor 170 between input 112 and circuit ground.

The gate terminal of transistor 166 ("PBIAS") is coupled to the drain terminal of n-channel transistor 172 whose source is at circuit ground and whose gate is coupled to node 176. In like manner, the gate terminal of transistor 170 ("PBIASB") is coupled to the source terminal of n-channel transistor 174 whose drain is at circuit ground and whose gate is also coupled to node 176. P-channel transistor 178 has its source terminal coupled to $V_{cc}$ and its drain terminal coupled to the gate of another p-channel transistor 180 which has its source coupled to input 110. The drain terminals of transistors 178 and 180 are coupled to node 162 as well as to circuit ground through series connected n-channel transistors 182 and 184. Similarly, p-channel transistor 188 has its source terminal coupled to $V_{cc}$ and its drain terminal coupled to the gate of another p-channel transistor 190 which has its source coupled to input 112. The drain terminals of transistors 188 and 190 are coupled to node 160 as well as to circuit ground through series connected n-channel transistors 192 and 194. The gates of transistors 178, 184 and 188 are connected together at node 186 ("DER") while the gate terminals of transistors 182 and 192 are respectively connected to inputs 112 and 110. The gate terminal of transistor 194 is at circuit ground.

In operation, transistor 118 and transistor 122 provide feedback to the signals input to the amplifier 100 on inputs 110 and 112 respectively. If NODE 1 (at the drain terminal of the transistor 102) were tied to $V_{cc}$ directly, at increased $V_{cc}$ levels too much feedback would be induced and the differential signal on inputs 110 and 112 would be compressed. The compression of the differential input signals causes the amplifier 100 to be very fast when reading new data. This, in turn, poses a problem in a synchronous DRAM application if the clock then latches erroneous data. Another potential problem with a compressed differential input signal is the possibility of noise coupling on the inputs 110 and 112, thereby amplifying the wrong data.

Through the use of transistor 102 as a regulator coupling the NODE 1 to $V_{cc}$ (and having its gate terminal coupled to $V_{ccp}$) the voltage on NODE 1 is $V_{cc}$ when $V_{cc} < V_{ccp} - V_{tn}$. When $V_{cc} \geq V_{ccp}$, NODE 1 is held substantially at a level of $V_{ccp} - V_{tn}$ even for wide variations in voltage on the $V_{cc}$ source. As noted previously, the differential signal driven on the inputs 110 and 112 is amplified by the amplifier 100 and supplied as ID and IDB on outputs 128 and 130 respectively. The amplifier 100 also provides feedback to the signals at the inputs 110 and 112 as previously described.

Figure 4:
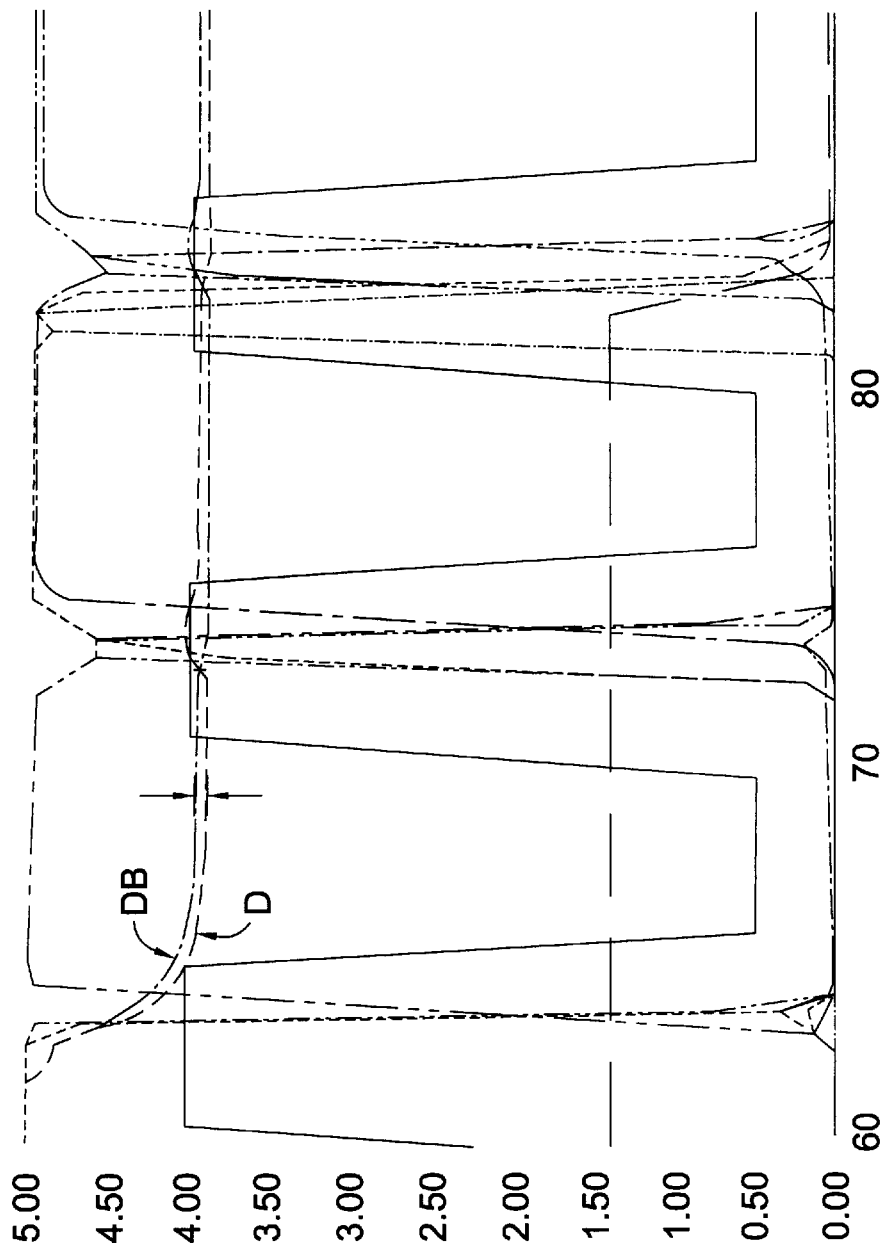
FIG. 4 is a graphical representation of the differential signals input to the main amplifier ("D" and "DB") when no regulator transistor is utilized to couple the NODE 1 of FIG. 3 to $V_{cc}$ illustrating the relatively small voltage differential which results between the two signals.

With reference additionally now to FIG. 4, the differential signals supplied by the sense amplifier 22 (FIG. 2) as signal D (constant width dashed line) and DB (long and short dashed line) to inputs 110 and 112 of the amplifier 100 without the use of the regulator transistor 102 are shown.

Figure 5:
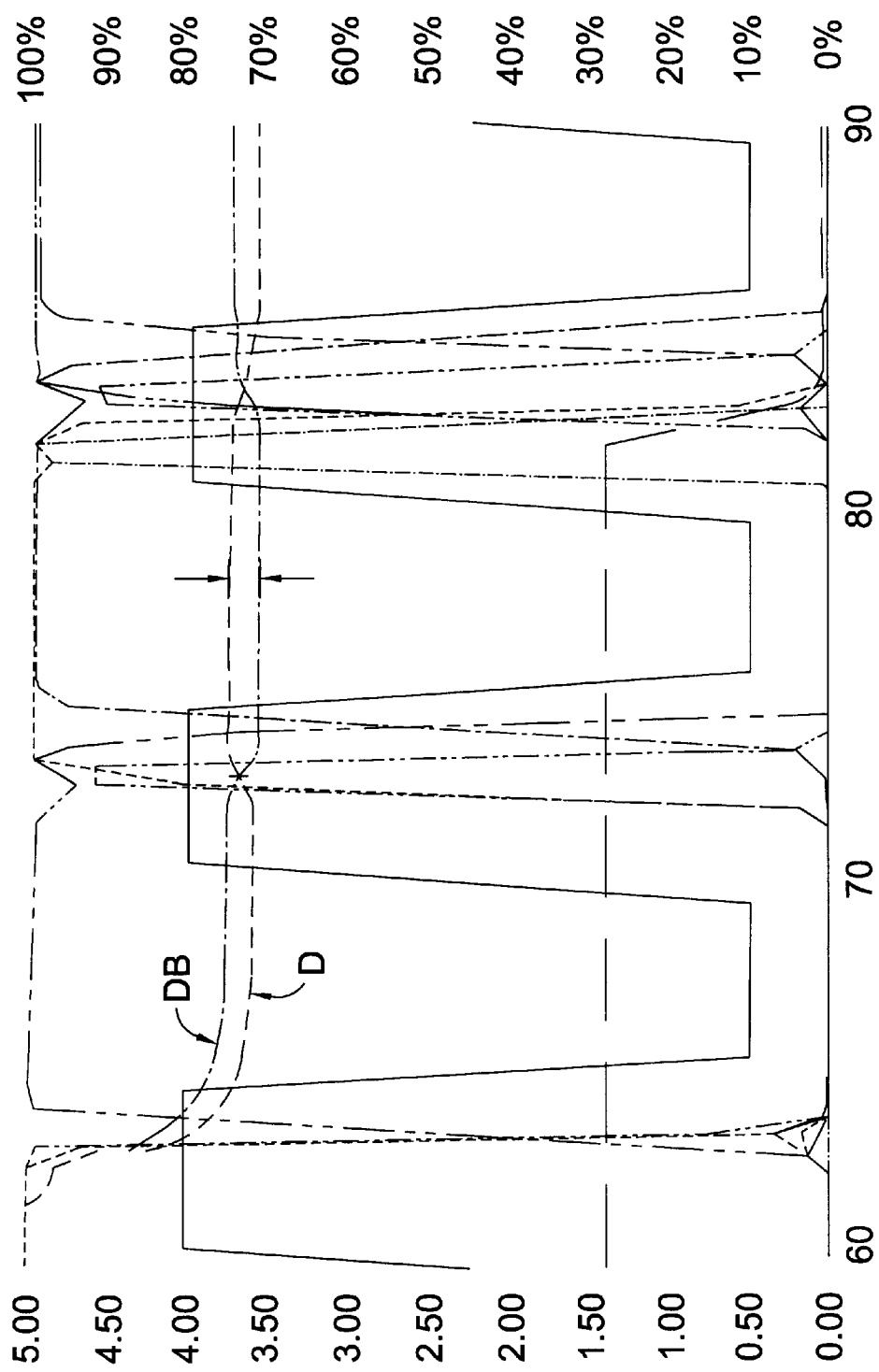
FIG. 5 is a further corresponding graphical representation of the signals "D" and "DB" wherein an n-channel transistor as shown in FIG. 3 is utilized to couple the NODE 1 to $V_{cc}$, with its gate coupled to $V_{ccp}$, in an exemplary application wherein $V_{cc}$=5.0 volts and $V_{ccp}$=5.2 volts and resulting in a much improved voltage differential between the input signals.

In contrast, FIG. 5 shows the same signals utilizing transistor 102 as a regulator 26 (FIG. 2) connected as illustrated in FIG. 3 where $V_{cc} = 5.0$ volts and $V_{ccp} = 5.2$ volts. As can be seen, a much greater differential voltage between signals D and DB results.

While there have been described above the principles of the present invention in conjunction with a specific circuit application, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit memory device comprising a sense amplifier and an associated differential amplifier, said sense amplifier being coupled to a first regulated voltage source and said differential amplifier having an unregulated voltage source associated therewith, said differential amplifier comprising:
    a regulator coupled to said unregulated voltage source and a second regulated voltage source which is a function of said first regulated voltage source, said regulator furnishing a regulated voltage output to said differential amplifier which is a function of said first and second regulated voltage sources.

2. The integrated circuit memory device of claim 1 wherein said second regulated voltage source comprises $V_{ccp}$.

3. The integrated circuit memory device of claim 2 wherein said unregulated voltage source comprises $V_{cc}$.

4. The integrated circuit memory device of claim 1 wherein said regulator comprises a semiconductor switching device.

5. The integrated circuit memory device of claim 4 wherein said switching device comprises an MOS transistor.

6. A method for furnishing a regulated voltage to a differential amplifier associated with an unregulated voltage source in an integrated circuit memory device including a sense amplifier coupled to a regulated voltage source comprising:
    coupling said unregulated voltage source to a first input of a voltage regulator associated with said differential amplifier;
    supplying a second regulated voltage to a second input of said voltage regulator, said second regulated voltage being a function of a voltage output of said regulated voltage source; and
    providing said regulated voltage to said differential amplifier, said regulated voltage being a function of said second regulated voltage.

7. The method of claim 6 wherein said step of supplying said second regulated voltage is carried out by a source of $V_{ccp}$.

8. The method of claim 6 wherein said step of coupling said unregulated voltage source is carried out by a source of $V_{cc}$.

9. The method of claim 6 wherein said steps of coupling, supplying and providing are carried out by means of a semiconductor switching device.

10. The method of claim 9 wherein said step of coupling is carried out by means of a source terminal of an n-channel MOS transistor.

11. The method of claim 10 wherein said step of supplying is carried out by means of a gate terminal of said n-channel MOS transistor.

12. The method of claim 10 wherein said step of providing is carried out by means of a drain terminal of said n-channel MOS transistor.

13. The method of claim 12 wherein said regulated voltage substantially comprises said second regulated voltage minus a threshold voltage of said n-channel MOS transistor.

14. An integrated circuit memory device comprising a sense amplifier and an associated differential amplifier, said sense amplifier being coupled to a first regulated voltage source and said differential amplifier having an unregulated voltage source associated therewith, said differential amplifier comprising:
    an n-channel transistor coupled to said unregulated voltage source and a second regulated voltage source which is a function of said first regulated voltage source, said n-channel transistor furnishing a regulated voltage output to said differential amplifier which is a function of said first and second regulated voltage sources.

15. The integrated circuit memory device of claim 14 wherein said regulated voltage output substantially comprises a voltage of said second regulated voltage source minus a threshold voltage of said n-channel transistor.

* * * * *